(12) United States Patent
Thompson et al.

(10) Patent No.: US 10,427,930 B2
(45) Date of Patent: Oct. 1, 2019

(54) MEMS SENSOR WITH HIGH VOLTAGE SWITCH

(71) Applicant: InvenSense, Inc., San Jose, CA (US)

(72) Inventors: Matthew Thompson, Beaverton, OR (US); Joseph Seeger, Menlo Park, CA (US)

(73) Assignee: InvenSense, Inc., San Jose, CA (US)

( * ) Notice: Subject to any disclaimer, the term of this patent is extended or adjusted under 35 U.S.C. 154(b) by 39 days.

(21) Appl. No.: 15/620,619

(22) Filed: Jun. 12, 2017

(65) Prior Publication Data

US 2018/0002162 A1    Jan. 4, 2018

Related U.S. Application Data

(62) Division of application No. 14/723,927, filed on May 28, 2015, now Pat. No. 9,708,176.

(51) Int. Cl.
*B81B 3/00* (2006.01)
*B81B 7/02* (2006.01)
*H01H 1/00* (2006.01)

(52) U.S. Cl.
CPC ............. *B81B 3/0086* (2013.01); *B81B 7/02* (2013.01); *H01H 1/0036* (2013.01); *B81B 2201/014* (2013.01); *B81B 2201/0214* (2013.01); *B81B 2201/0235* (2013.01); *B81B 2201/0242* (2013.01); *B81B 2201/0257* (2013.01); *B81B 2201/0264* (2013.01); *B81B 2201/0271* (2013.01); *B81B 2201/0292* (2013.01); *B81B 2201/036* (2013.01); *B81B 2203/0118* (2013.01); *B81B 2203/0307* (2013.01);

(Continued)

(58) Field of Classification Search
CPC .......... B81B 3/0086; B81B 2201/0242; B81B 2201/0292; B81B 2201/0264; B81B 2201/0257; B81B 2201/0271; B81B 2201/0307; B81B 2201/0118; B81B 2201/04; H01H 59/0009
See application file for complete search history.

(56) References Cited

U.S. PATENT DOCUMENTS

| 6,787,438 B1 * | 9/2004 | Nelson | B81B 3/0072 257/254 |
| 2005/0062565 A1 * | 3/2005 | Chou | H01H 59/0009 335/78 |

(Continued)

OTHER PUBLICATIONS

Self-assembled monolayers as anti-stiction coatings for MEMS: characteristics and recent developments. Roya Maboudian ), W. Robert Ashurst, Carlo Carraro Department of Chemical Engineering, University of California, Berkeley, CA 94720, USA; accepted Oct. 5, 1999.*

(Continued)

*Primary Examiner* — Thomas L Dickey
(74) *Attorney, Agent, or Firm* — Haley Guiliano LLP; Joshua Van Hoven

(57) ABSTRACT

A system and/or method for utilizing microelectromechanical systems (MEMS) switching technology to operate MEMS sensors. As a non-limiting example, a MEMS switch may be utilized to control DC and/or AC bias applied to MEMS sensor structures. Also for example, one or more MEMS switches may be utilized to provide drive signals to MEMS sensors (e.g., to provide a drive signal to a MEMS gyroscope).

10 Claims, 5 Drawing Sheets

(52) U.S. Cl.
CPC ..... *B81B 2203/04* (2013.01); *B81B 2207/012* (2013.01); *B81C 2203/0792* (2013.01)

(56) References Cited

U.S. PATENT DOCUMENTS

| | | | |
|---|---|---|---|
| 2007/0159510 A1* | 7/2007 | Hong | B41J 2/04541 347/54 |
| 2009/0159410 A1* | 6/2009 | Wang | H01H 59/0009 200/181 |
| 2011/0199284 A1* | 8/2011 | Davis | G02B 26/0833 345/31 |
| 2012/0142144 A1* | 6/2012 | Taheri | B81B 7/007 438/107 |
| 2012/0156820 A1* | 6/2012 | Kim | B81C 1/00626 438/50 |
| 2012/0175715 A1* | 7/2012 | Hammond | H01H 1/0036 257/415 |

OTHER PUBLICATIONS

Anti-Stiction Coatings for High Reliability MEMS; Nilesh Gunda, Santosh K. Jha and Suri A. Sastri Surmet Corporation, 33 B Street Burlington, MA 01803 (USA).*

* cited by examiner

MEMS SENSOR WITH HIGH VOLTAGE SWITCH

CROSS-REFERENCE TO RELATED APPLICATIONS

This application is a divisional application of U.S. application Ser. No. 14/723,927, filed on May 28, 2015, and entitled "MEMS SENSOR WITH HIGH VOLTAGE SWITCH", which is incorporated herein by reference.

BACKGROUND

Various microelectromechanical systems (MEMS) sensor architectures comprise sensor circuitry implemented in one or more integrated circuits. Such integrated circuits may, for example, be implemented with CMOS technology. Particular types of integrated circuit technology may, however, be unable to effectively switch signals at voltage levels that are desirable for efficient MEMS operation.

SUMMARY

Figure 1:
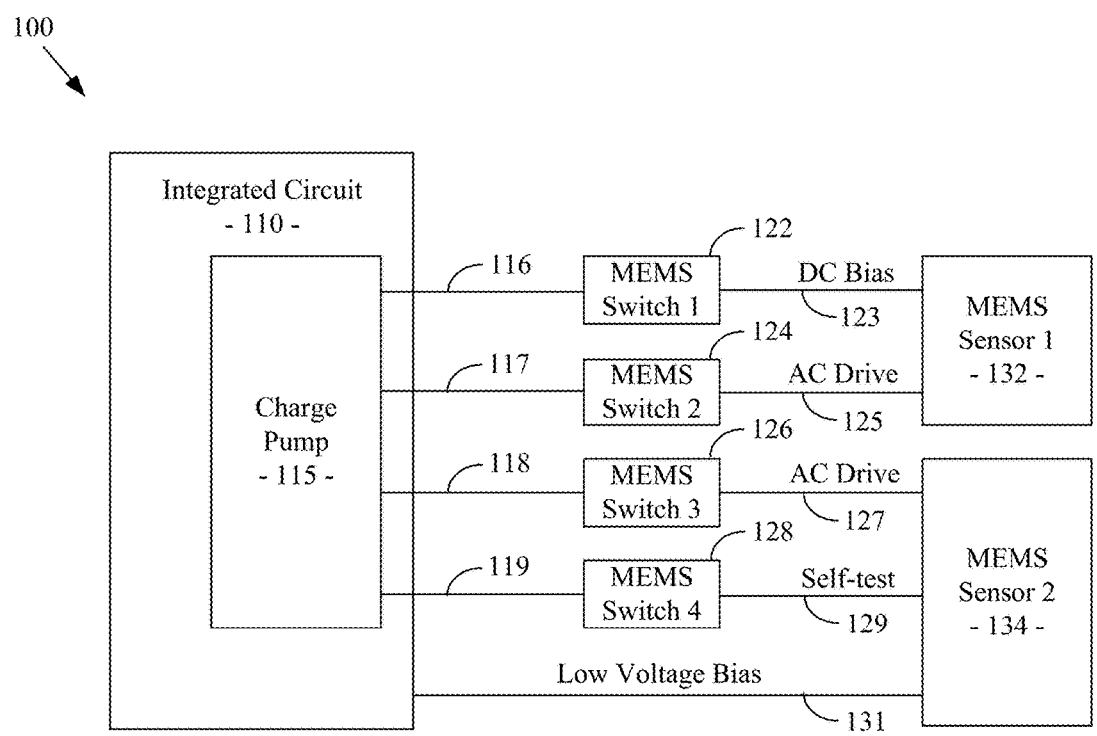
FIG. 1 shows a block diagram of an example MEMS sensor system, in accordance with various aspects of the present disclosure.

Various aspects of this disclosure comprise a system and/or method for utilizing MEMS switching technology to operate MEMS sensors. As a non-limiting example, a MEMS switch may be utilized to control DC and/or AC bias applied to MEMS sensor structures. Also for example, one or more MEMS switches may be utilized to provide drive signals to MEMS sensors (e.g., to provide a drive signal to a MEMS gyroscope).

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

The following discussion may at times utilize the phrase "A and/or B." Such phrase should be understood to mean just A, or just B, or both A and B. Similarly, the phrase "A, B, and/or C" should be understood to mean just A, just B, just C, A and B, A and C, B and C, or all of A and B and C.

The following discussion may at times utilize the phrases "operable to," "operates to," and the like in discussing functionality performed by particular hardware, including hardware operating in accordance with software instructions. The phrases "operates to," "is operable to," and the like include "operates when enabled to." For example, a module that operates to perform a particular operation, but only after receiving a signal to enable such operation, is included by the phrases "operates to," "is operable to," and the like. Also for example, circuitry is "operable" to perform a function whenever the circuitry comprises the necessary hardware and code (if any is necessary) to perform the function, regardless of whether performance of the function is disabled, or not enabled (e.g., by a user-configurable setting, factory trim, etc.).

The following discussion may at times refer to various system or device functional modules or circuitry (e.g., sensor processing circuitry, proof mass drive control circuitry, etc.). It should be understood that the functional modules or circuitry were selected for illustrative clarity and not necessarily for providing distinctly separate hardware and/or software modules. For example, any one or more of the modules or circuits discussed herein may be implemented by shared hardware, including for example a shared processor. Also for example, any one or more of the modules discussed herein may share software portions, including for example subroutines. Additionally for example, any one or more of the modules discussed herein may be implemented with independent dedicated hardware and/or software. Accordingly, the scope of various aspects of this disclosure should not be limited by arbitrary boundaries between modules and/or circuits unless explicitly claimed. Additionally, it should be understood that when the discussion herein refers to a module or circuit performing a function, the discussion is generally referring to either a pure hardware module implementation and/or a processor operating in accordance with software. Such software may, for example, be stored on a non-transitory machine-readable medium.

In various example implementations discussed herein, a chip is defined to include at least one substrate typically formed from a semiconductor material. A single chip may for example be formed from multiple substrates, where the substrates are mechanically bonded to preserve the functionality. Multiple chip (or multi-chip) includes at least 2 substrates, wherein the 2 substrates are electrically connected, but do not require mechanical bonding.

A package provides electrical connection between the bond pads on the chip (or for example a multi-chip module) and a metal lead that can be soldered to a printed circuit board (or PCB). A package typically comprises a substrate and a cover. An Integrated Circuit (IC) substrate may refer to a silicon substrate with electrical circuits, typically CMOS circuits. A MEMS substrate provides mechanical support for the MEMS structure(s). The MEMS structural layer is attached to the MEMS substrate. The MEMS substrate is also referred to as handle substrate or handle wafer. In some embodiments, the handle substrate serves as a cap to the MEMS structure.

In the described examples, an electronic device incorporating a sensor (e.g., one or more of the sensors discussed herein) may, for example, employ a motion tracking module also referred to as Motion Processing Unit (MPU) that includes at least one sensor in addition to electronic circuits. The at least one sensor may comprise any one or more of a variety of sensors, such as for example a gyroscope, a compass, a magnetometer, an accelerometer, a microphone, a pressure sensor or barometer, a resonator, a mass sensor, a chemical sensor, a proximity sensor, a moisture sensor, a temperature sensor, a biometric sensor, or an ambient light sensor, among others known in the art.

Some example system implementations may, for example, comprise an accelerometer, gyroscope, and magnetometer or other compass technology, which each provide a measurement along three axes that are orthogonal relative to each other, and may be referred to as 9-axis devices. Other example system implementations may, for example, comprise an accelerometer, gyroscope, compass, and pressure sensor, and may be referred to as 10-axis devices. Other embodiments might not include all the sensors or may provide measurements along one or more axes.

The various sensors discussed herein may, for example, be formed on a first substrate. Various embodiments may, for example, include solid-state sensors and/or any other type of sensors. The electronic circuits in the MPU may, for example, receive measurement outputs from the one or more sensors. In various example implementations, the electronic circuits process the sensor data. The electronic circuits may, for example, be implemented on a second silicon substrate. In some example implementations, the first substrate may be vertically stacked, attached and electrically connected to the second substrate in a single semiconductor chip, while in other example implementations, the first substrate may be disposed laterally and electrically connected to the second substrate in a single semiconductor package (e.g., both attached to a common packaging substrate or other material). In other example implementations, the sensors may, for example, be formed on different respective substrates (e.g., all attached to a common packaging substrate or other material).

In an example implementation, the first substrate is attached to the second substrate through wafer bonding, as described in commonly owned U.S. Pat. No. 7,104,129, which is hereby incorporated herein by reference in its entirety, to simultaneously provide electrical connections and hermetically seal the MEMS devices. This fabrication technique advantageously enables technology that allows for the design and manufacture of high performance, multi-axis, inertial sensors in a very small and economical package. Integration at the wafer-level minimizes parasitic capacitances, allowing for improved signal-to-noise relative to a discrete solution. Such integration at the wafer-level also enables the incorporation of a rich feature set which minimizes the need for external amplification.

Reducing the fabrication cost of MEMS devices is generally related to the material footprint, and one example way to reduce size and therefore cost of MEMS is by using smaller (e.g., nanometer "nm") CMOS technology. 180 nm, 40 nm and 18 nm are examples of nm CMOS technology. The nm number describes the smallest feature and therefore a circuit on 18 nm CMOS will fit in a smaller foot print than the same circuit on 180 nm CMOS. However, transistors on relatively smaller nm CMOS have a lower break down voltage than on relatively larger nm CMOS, and therefore cannot switch the same voltage magnitude as the larger nm CMOS counterpart. Voltage magnitude for DC and AC signals affects MEMS sensor sensitivity, and voltage duty cycling affects MEMS power consumption and noise. Therefore a problem may arise using low nm CMOS to reduce cost, as it also lowers the switching voltage magnitude, which degrades the MEMS sensor performance. Various aspects of this disclosure provide for lower cost by using low nm CMOS without reducing MEMS sensor performance, for example by utilizing a MEMS high voltage switch instead of the low nm CMOS transistor switch.

Commercial switches are large and discrete devices. Such switches are designed for relatively high current and thus commonly made from metal. The MEMS switches in accordance with various aspects of this disclosure, however, are significantly smaller than commercially available switches and/or are made with a same MEMS process as that of the MEMS sensors discussed herein. Since electrical current levels in accordance with various aspects of this disclosure may be relatively small (e.g., less than 1 milliamp, less than 100 microamps, etc.), the MEMS switches may be substantially smaller than those commercially available.

The general focus of current MEMS switch research is on relatively high switching frequencies (e.g., above 1 MHz, above 1 GHz, etc.) and maintaining a long device life under operation at such high switching frequencies. The MEMS switches in accordance with various aspects of this disclosure, however, may switch in the KHz range (e.g., less than 30 KHz, less than 100 KHz, etc.), and thus lifetime issues are of significantly less concern than with their high-frequency counterparts.

Accordingly, in accordance with various aspects of this disclosure, a new MEMS switch is proposed, for example in conjunction with a low-nm CMOS. The new MEMS switch, for example, may be specifically designed for the needs (e.g., electrical current magnitude, switching frequency, etc.) of MEMS sensors interfacing with low-nm CMOS.

MEMS sensors are biased at a DC voltage and some sensors are driven with an AC voltage. Both the DC voltage bias and the AC voltage signals may impact the sensitivity of the sensor and it may therefore be beneficial to use a high DC bias voltage and a high AC voltage. Switching may also, for example, affect other sensor performance parameters (e.g., self-test, power, and noise). Sensors may, for example, be turned on, off, or duty cycled to control power consumption allowing for low power and/or low noise sensor operation. To achieve these states of performance there may, for example, be a need to switch high voltage signals. Charge pumps in CMOS circuits may, for example, be used to increase the voltage magnitude and can generally be implemented in low nm CMOS technology. However, once the high voltage is generated, the low nm CMOS technology transistors cannot effectively switch the high voltage signals, for example because of the lower voltage breakdown associated with low nm CMOS technology.

Accordingly, various aspects of the present disclosure provide a system and/or method for utilizing MEMS switching technology (e.g., mechanical switching technology) to operate MEMS sensors, for example in MEMS sensor architectures in which underlying semiconductor circuitry is incapable of effectively performing the desired switching. In accordance with various aspects of the present disclosure any of a variety of MEMS switch structures may be utilized, non-limiting examples of which will be discussed herein.

FIG. 1 shows a block diagram of an example MEMS sensor system 100, in accordance with various aspects of the present disclosure. The system 100 (e.g., implemented on a single chip, in a single package, in a multi-package circuit, etc.) may, for example, comprise CMOS circuitry and MEMS switches.

The example system 100 comprises an integrated circuit (e.g., a silicon die) 110. A portion of the example integrated circuit 110 implements at least one chart pump 115. Though the example system 100 only shows one charge pump 115, it should be understood that a plurality of charge pumps may be implemented.

The example system 100 also comprises a plurality of MEMS switches 122, 124, 126, and 128, each of which receiving a respective signal from the charge pump 115. The first MEMS switch 122, for example, receives a high voltage signal (e.g., a 25V signal, a signal at a voltage above 20V, a signal at a voltage above 15V, etc.). For example, the first MEMS switch 122 may receive a first signal 116 from the charge pump 115 at a first voltage level (e.g., that the CMOS technology utilized to implement the integrated circuit 110 is not capable of effectively switching). Such first voltage level may, for example, be at or above the breakdown voltage of a transistor of the integrated circuit 110. The first MEMS switch 122, for example, is utilized to switch on and off a DC bias signal 123 to a first MEMS sensor 132 (e.g., for example a gyroscope, a compass, a magnetometer, an accelerometer, a microphone, a pressure sensor, a proximity sensor, a moisture sensor, a temperature sensor, a biometric sensor, or an ambient light sensor, etc.).

The second MEMS switch 124, or for example a plurality of MEMS switches, receives a second signal 117 from the charge pump 115 at a second voltage level (e.g., that the CMOS technology utilized to implement the integrated circuit 110 is not capable of effectively switching, not capable of switching effectively at a desired switching rate, etc.). Such second voltage level may, for example, be the same as the first voltage level. Such second voltage level may, for example, be at or above the breakdown voltage of a transistor of the integrated circuit 110. The second MEMS switch 124, for example, is utilized to switch an AC drive signal 125 to the first MEMS sensor 132.

The third MEMS switch 126, or for example a plurality of MEMS switches, receives a third signal 118 from the charge pump 115 at a third voltage level (e.g., that the CMOS technology utilized to implement the integrated circuit 110 is not capable of effectively switching, not capable of switching effectively at a desired switching rate, etc.). Such third voltage level may, for example, be the same as the first and/or second voltage level. Such third voltage level may, for example, be at or above the breakdown voltage of a transistor of the integrated circuit 110. The third MEMS switch 126, for example, is utilized to switch an AC drive signal 127 to a second MEMS sensor 134 (e.g., for example a gyroscope, a compass, a magnetometer, an accelerometer, a microphone, a pressure sensor, a proximity sensor, a moisture sensor, a temperature sensor, a biometric sensor, or an ambient light sensor, etc.).

The fourth MEMS switch 128, or for example a plurality of MEMS switches, receives a fourth signal 119 from the charge pump 115 at a fourth voltage level (e.g., that the CMOS technology utilized to implement the integrated circuit 110 is not capable of effectively switching, not capable of switching effectively at a desired switching rate, etc.). Such fourth voltage level may, for example, be the same as the first voltage level, second voltage level and/or third voltage level. Such fourth voltage level may, for example, be at or above the breakdown voltage of a transistor of the integrated circuit 110. The fourth MEMS switch 128, for example, is utilized to switch one or more self-test signals 129 (e.g., one or more DC and/or AC signals) to the second MEMS sensor 134.

The example system 100 is also shown providing a fifth signal 131, for example at a fifth voltage level to the second MEMS sensor 134. The fifth signal 129 may, for example, be a low voltage signal (e.g., at a fifth voltage level, for example 5V, 4V, 2.5V or less, etc.) to the second MEMS sensor 134. Such a fifth voltage level may, for example, be lower than the first voltage level, second voltage level, third voltage level and/or fourth voltage level. Such a fifth voltage level may, for example, be below the breakdown voltage of a transistor of the integrated circuit 110.

Though not illustrated in FIG. 1 for the sake of clarity, the switching of the MEMS switches 122, 124, 126, and 128 may be controlled by control circuitry of the integrated circuit 110. For example, the integrated circuit 110 may operate to determine when to actuate the MEMS switches and then output one or more signals to cause such actuation.

The configuration of the MEMS switches 122, 124, 126 and 128 may comprise any of a variety of characteristics, non-limiting examples of which are presented herein (e.g., in FIGS. 2-6).

Figure 2A:
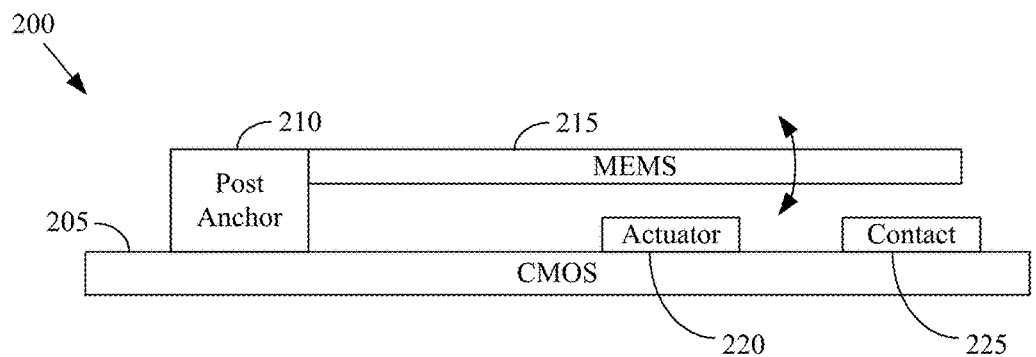
FIG. 2A-2C show example block diagrams of out-of-plane MEMS switches, in accordance with various aspects of the present disclosure.
Figure 2B:
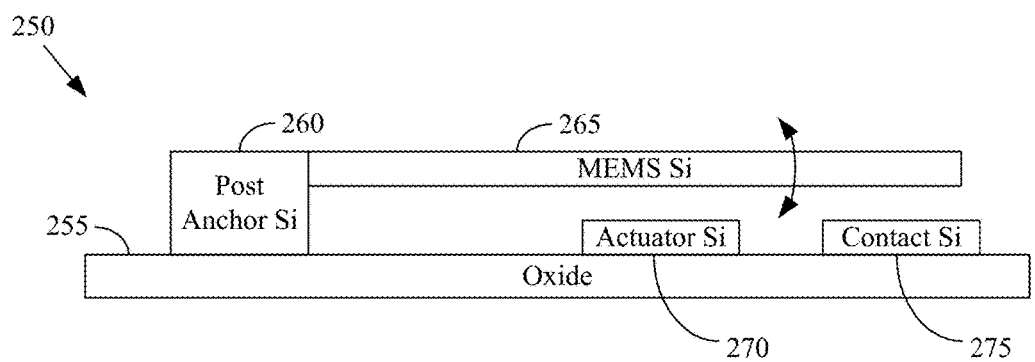
Figure 2C:
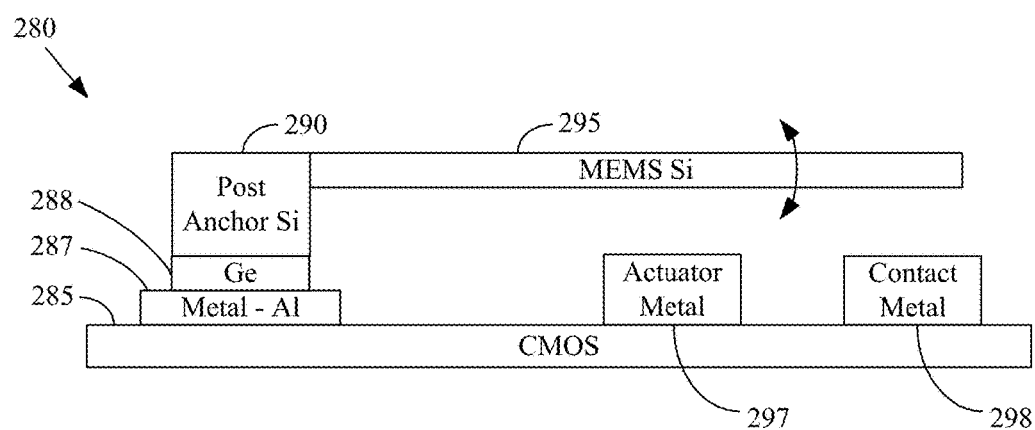

FIGS. 2A-2C show example block diagrams of out-of-plane MEMS switches, in accordance with various aspects of the present disclosure. Any of the MEMS switches 200, 250 and 280 shown in FIGS. 2A-2C may share any or all characteristics with each other.

Referring to FIG. 2A, the example MEMS switch 200 comprises an integrated circuit (IC) layer 205, for example a CMOS layer. The switch 200 also comprises a MEMS post anchor 210, which couples the MEMS switch lever 215 to the IC layer 205. The switch 200 also comprises an actuator electrode 220 and a contact electrode 225.

In operation, a switch control signal applied to the actuator electrode 220 drives the MEMS switch lever 215 (or arm, or flexible arm) to touch the contact electrode 225, and removal of the switch control signal allows the MEMS switch lever 215 to return to its steady state position that is out of touch with the contact electrode 225. As shown in FIGS. 2B and 2C, the contact electrode 225 and/or the actuator electrode 220 may, for example, be made from various materials, for example comprising one or more of: a semiconductor material such as silicon (e.g., doped silicon, a metal, titanium nitride (TiN), etc.).

Though not shown in some of the figures, the post anchor 210 may be connected to an electrical terminal and provide a conductive path between the electrical terminal and the MEMS switch lever 215. The post anchor 210 and MEMS switch lever 215 may then be energized, and transfer such energy to the contact electrode 225 when the MEMS switch lever 215 is actuated to touch the contact electrode 225.

In an example scenario, the MEMS switch lever 215 (or arm) may be energized at 25V, so that the contact electrode 225 would be energized at 25V or 0V, depending on whether the MEMS switch lever 215 is touching the contact electrode 225 or not, respectively.

The actuator electrode 220 may, for example, comprise an electrostatic actuator (e.g., a low-voltage actuator controlled by a CMOS transistor, for example of the IC 110 of FIG. 1) that applies an attractive force to the MEMS switch lever 215 when it is desired to pull the MEMS switch lever 215 into contact with the contact electrode 225. The control signal applied to the actuator electrode 220 may, for example, comprise a voltage that does not exceed the break down voltage of the controlling circuitry (e.g., CMOS transistors of the integrated circuit 110). For example, the control signal applied to the actuator electrode 220 may be a 5V signal, a signal at or below 2.5V, etc.

It should be noted that although a normally open configuration is illustrated for the MEMS switch 200, a normally closed configuration may also be used.

The portion of the MEMS switch lever 215 that contacts the contact electrode 225, and the contact electrode 225, may be shaped and sized to conduct enough charge for the particular application. For example, the size and/or shape of respective mating surfaces on the contact electrode 225 and the MEMS switch lever 215 may be selected. Additionally, the mating surfaces may be smoothed and/or coated to enhance conductivity between the contacting surfaces when mated. The MEMS material used for MEMS components of the switch 200 may be selectively chosen to provide the desired conductivity. For example, a low-doped MEMS material at about 0.02 ohms/cm or a highly-doped MEMS material at about 0.005 ohms/cm may be selected (e.g., for one or more mating surfaces, for example the contact electrode, MEMS switch lever 215, etc.). Other coatings may, for example, be applied to surfaces (e.g., mating surfaces) to improve performance. An example of this is the application of Self-Assembled Monolayers (SAM) to prevent sticking/welding after contact called stiction. Note that although the MEMS switch lever 215 (or arm) is shown implemented in a MEMS layer, a MEMS switch lever may also be formed in a CMOS layer.

Turning now to FIG. 2B, the MEMS switch 250 is shown in a configuration in which the MEMS switch lever 265 (or arm), the post anchor 260, the actuator electrode 270, and the contact electrode 275 are all formed from semiconductor material (e.g., silicon).

The post anchor 260, actuator electrode 270, and contact electrode 275 are formed on an oxide layer 255. Though not illustrated, below the oxide layer 255 may be a silicon layer, for example forming a silicon-oxide-silicon layered topology. In such a configuration, for example, there might not be any semiconductor circuitry (e.g., active devices) formed in the silicon. For example, semiconductor circuitry may be coupled to the MEMS switch components by wire bonding.

In this example configuration, the MEMS switch lever 265 contacts the contact electrode 270 in a silicon-to-silicon contact. Unless coated with a smooth material, the contact area is generally rough. Accordingly, the size and shape of the contact electrode 270 and the portion of the MEMS switch arm 265 that contacts the contact electrode 270 should be selected to provide at least the minimum desired conductance.

Turning now to FIG. 2C, the MEMS switch 280 is shown in an example configuration in which the MEMS material is coupled to the IC 285 (e.g., CMOS) circuitry, for example utilizing a eutectic bond (e.g., an aluminum-germanium eutectic bond). In the example configuration, the MEMS switch 280 may comprise a post anchor 290 and MEMS switch lever 295 made from silicon, an actuator electrode 297 and contact electrode 298 made from metal, and an aluminum-germanium eutectic bond 287 and 288 between the post anchor 290 and the IC 285 (e.g., CMOS) layer. In the MEMS switch 280, the MEMS switch lever 295 (or arm) contacts the metal contact electrode 298 when actuated. The point of contact is thus a silicon-to-metal contact. As opposed to the silicon-to-silicon contact discussed herein with regard to FIG. 2B, the example silicon-to-metal contact may provide a better conductive interface. For example, the contact electrode 298 metal (e.g., aluminum, copper, gold, etc.) may conform to the hardened silicon surface of the MEMS switch lever 295 over time and impacts. Though not illustrated, the MEMS switch 280 may also comprise an oxide on the IC 285 (e.g., CMOS) layer, for example, between the IC 285 and the metal members and/or between the metal members.

Though the example MEMS switch 280 illustrated in FIG. 2C comprises an aluminum-germanium eutectic bond, any of a variety of bonding technologies may be utilized.

FIGS. 2A-2C presented example block diagrams of example out-of-plane MEMS switches, in accordance with various aspects of the present disclosure. Other example configurations that may be utilized comprise in-plane switch configurations, examples of which will now be provided.

Figure 3A:
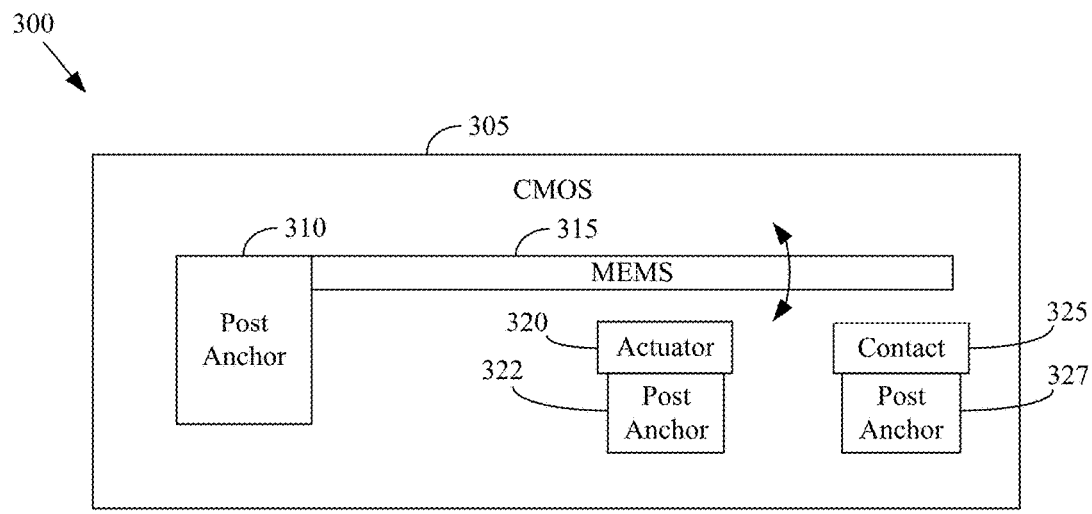
FIGS. 3A-3B show example block diagrams of in-plane MEMS switches, in accordance with various aspects of the present disclosure.
Figure 3B:
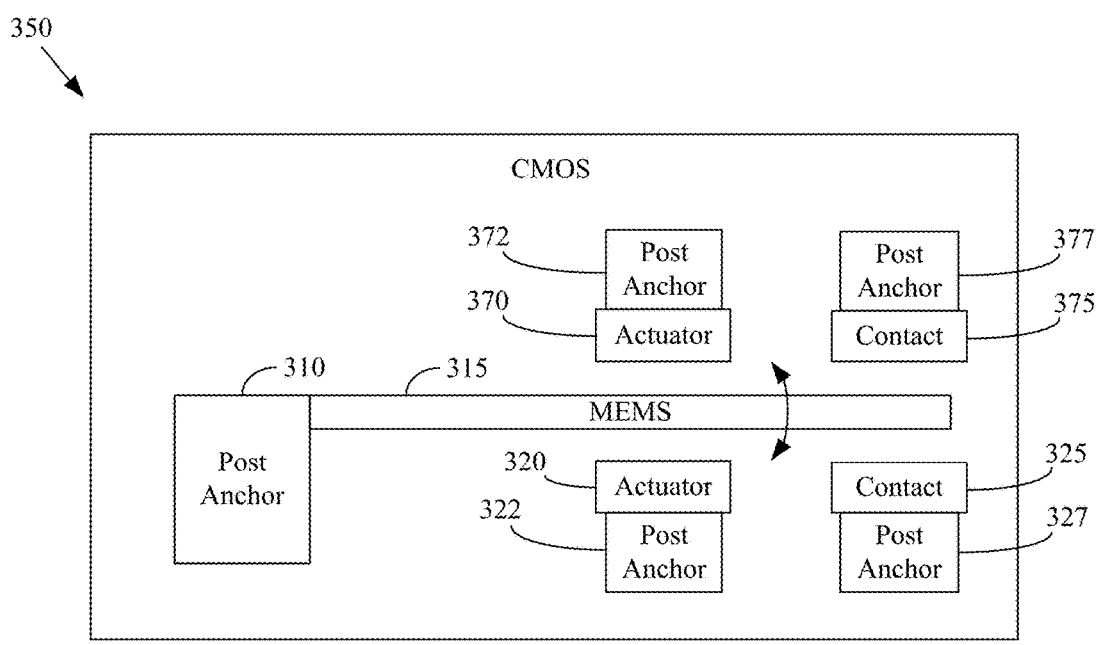

FIGS. 3A-3B show example block diagrams of in-plane MEMS switches, in accordance with various aspects of the present disclosure. Such figures show top-down views of respective in-plane MEMS switches. Though FIGS. 3A-3B show a configuration like FIG. 2C, in which the MEMS components are stacked on a CMOS layer, the scope of various aspects of this disclosure should not be limited to such structure. For example, the example in-plane switches of FIGS. 3A-3B may share any or all structural components with the MEMS switches 200, 250, and 280 illustrated in FIGS. 2A-2C and discussed herein.

Referring to FIG. 3A, the example MEMS switch 300 comprises a first post anchor 310 coupled to the IC layer 305 (e.g., CMOS layer) to which the MEMS switch lever 315 (or arm) is coupled. The MEMS switch 300 also comprises a second post anchor 322 to which the actuator 320 is coupled, and a third post anchor 327 to which the contact 325 is coupled. The MEMS switch 300 may, for example, may operate in a manner generally analogous to that discussed with regard to the MEMS switches 200, 250 and 280 of FIGS. 2A-2C, albeit with a different plane of motion for the switch lever 315.

The MEMS switch 300 is shown in a single-pole single-throw configuration (as with FIGS. 2A-2C), but the scope of various aspects of this disclosure is not so limited. For example, as shown in FIG. 3B, the MEMS switch 350 may be formed in a single-pole double-throw configuration. For example, the MEMS switch 350 may comprise any or all of the components of the MEMS switch 300. The MEMS switch 350 may also comprise a third post anchor 372, coupled to the IC layer 305, to which a second actuator 370 is coupled. The MEMS switch 350 may further comprise a fourth post anchor 377 to which a second contact 375 is coupled.

Additionally, though not shown, the MEMS switches discussed herein may be formed in any of a variety of other configurations depending on overall system needs (e.g., double-pole single-throw, double-pole double-throw, etc.).

As with FIGS. 2A-2C, the actuator (320 and/or 370) and/or contact (325 and/or 375) may be formed, for example, of semiconductor material or metal. Also for example, the bonding technique utilized between the MEMS material and the underlying semiconductor material (e.g., comprising CMOS circuitry, semiconductor material with no active electrical devices formed therein, etc.) may comprise eutectic bonding as discussed herein, or another technique.

The MEMS switches, examples of which are illustrated in FIGS. 2A-2C and 3A-3B may, for example, comprise relatively rigid (or stiff) components. In such a configuration, the structural soundness of the materials (e.g., silicon, metal, etc.) at the point of impact between the MEMS switch lever and the contact may directly affect the life of the switch. Compliance may be incorporated into the MEMS switch to reduce the effects of the lever/contact collision and thus increase the reliability and/or longevity of the switch. The compliance may, for example, be implemented mechanical structures (e.g., MEMS structures), coatings, etc. Non-limiting examples of compliance structures are illustrated in FIGS. 4A-4C.

Figure 4A:
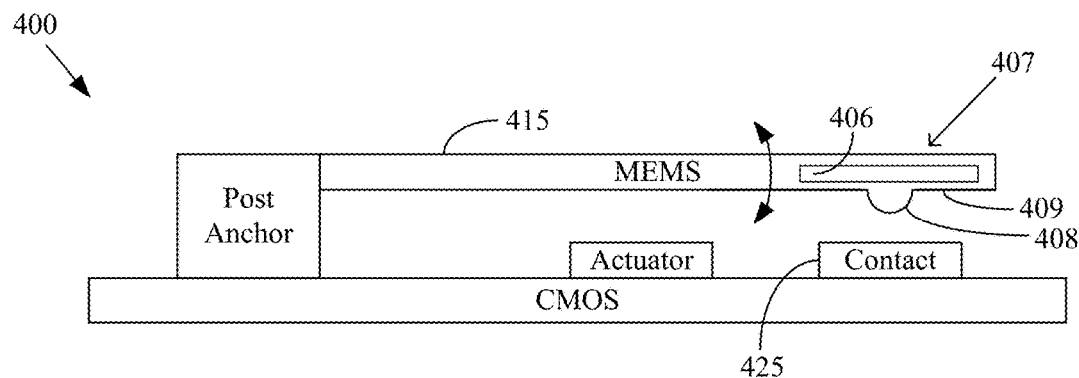
FIGS. 4A-4C show example block diagrams of compliant MEMS switches, in accordance with various aspects of the present disclosure.
Figure 4B:
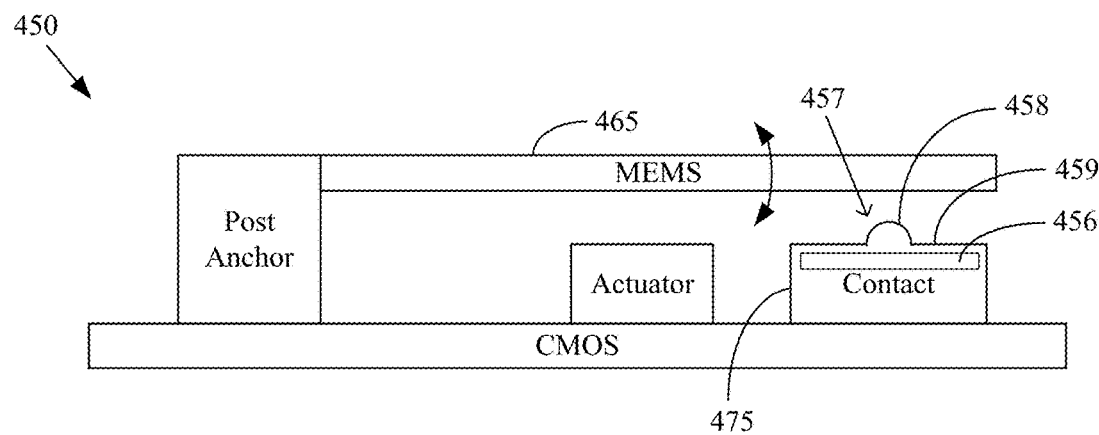
Figure 4C:
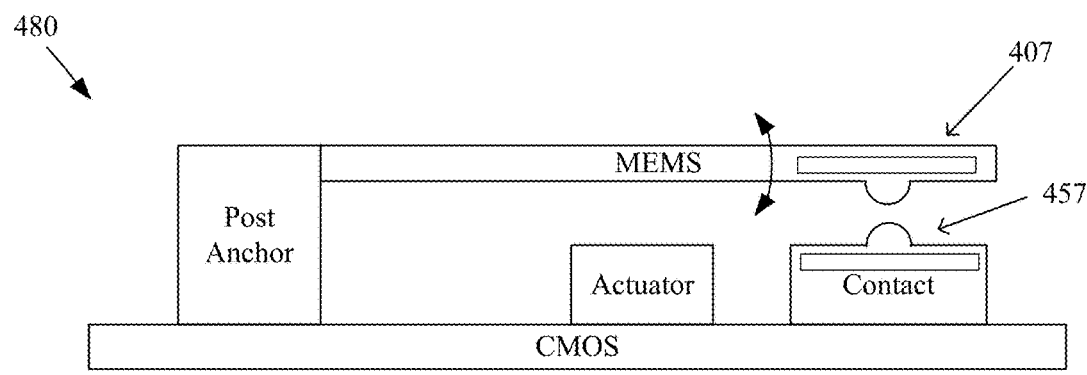

FIGS. 4A-4C show example block diagrams of compliant MEMS switches, in accordance with various aspects of the present disclosure. The MEMS switches 400, 450, and 480 may, for example, share any or all characteristics with the example MEMS switches illustrated in FIGS. 2A-2C and 3A-3B and discussed herein and/or any MEMS switches discussed herein.

The MEMS switch 400 shown in FIG. 4A may, for example, comprise a spring structure 407 incorporated into (e.g., formed integrally with) or attached to the MEMS switch lever 415 (or arm) at the point of contact to add structural compliance at the point of impact between the MEMS switch lever 415 and the contact 425. For example, the spring structure 407 may comprise a protrusion 408 to contact the contact 425, where the protrusion 408 is coupled to a flex portion 409 having spring compliance. The example spring structure 407 comprises a cavity 406 into which the flex portion 409 may flex when the protrusion 408 impacts the contact 425. The spring structure 407 may comprise characteristics of any of a variety of MEMS spring structures, for example, leaf springs, folded springs, lever arm springs, etc. The spring structure 407 may be formed in any of a variety of manners. For example, the spring structure 407 may be formed in the MEMS material (e.g., silicon) of the MEMS switch lever 415.

Also, the MEMS switch 450 shown in FIG. 4B may, for example, comprise a spring structure 457 incorporated into (e.g., formed integrally with) or attached to the contact 475 at the point of contact between the MEMS switch lever 465 and the contact 475 to add structural compliance at the point of impact between the MEMS switch lever 465 and the contact 475. For example, the spring structure 457 may comprise a protrusion 458 to contact the MEMS switch lever 465, where the protrusion 458 is coupled to a flex portion 459 having spring compliance. The example spring structure 457 comprises a cavity 456 into which the flex portion 459 may flex when the protrusion 458 impacts the MEMS switch lever 465. The spring structure 457 may comprise characteristics of any of a variety of MEMS spring structures, for example, leaf springs, folded springs, lever arm springs, etc. The spring structure 457 may be formed in any of a variety of manners. For example, the spring structure may be formed in the MEMS material (e.g., silicon) of the contact 475. Also for example, the spring structure 457 may be formed in the metal of a metal contact.

Additionally, the MEMS switch 480 shown in FIG. 4C may, for example, comprise both of the spring structures 407 and 457 shown in FIGS. 4A and 4B.

In addition to, or instead of, spring structures being built into the MEMS switch structure, various surface artifacts may also be incorporated into the surface of the MEMS material and/or contact material to increase the longevity of the MEMS switch. For example, scallops may be formed to enhance the reliability of the MEMS switch structure.

Also, in addition to, or instead of, compliant structures being built into the MEMS switch structure, various coatings may be utilized at the point of contact between the MEMS switch lever (or arm) and the contact to enhance the performance of the contact. Such coatings may, for example, provide compliance at the point of contact between the MEMS lever arm and the contact. For example, as discussed herein, a Self-Assembled Monolayer (SAM) may be applied, for example to prevent stiction. Such a SAM may also beneficially add compliance at the point of contact. Additionally, such coatings may be utilized to enhance conductivity, protect contacting surfaces from wear, etc.

As discussed herein, MEMS switching may be utilized to control bias voltages and/or drive signals for MEMS sensors. Further non-limiting examples of such utilization will now be provided.

Figure 5:
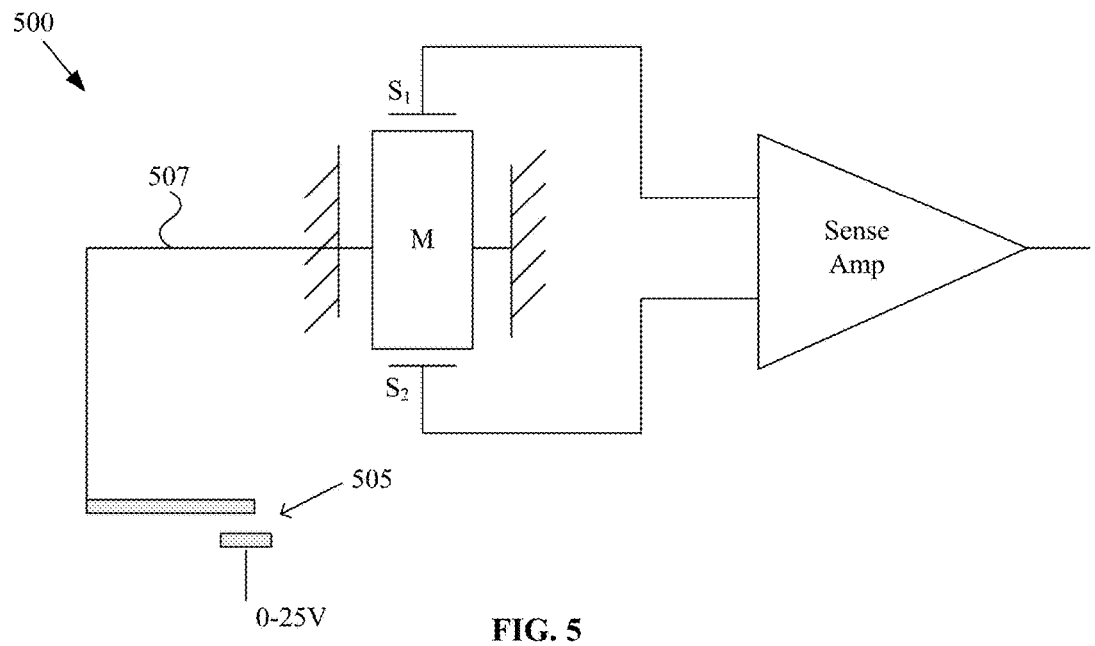
FIG. 5 shows an example block diagram of a MEMS sensor incorporating MEMS switching for bias control, in accordance with various aspects of the present disclosure.

Turning next to FIG. 5, such figure shows an example block diagram of a MEMS sensor 500 incorporating MEMS switching for bias control, in accordance with various aspects of the present disclosure. The bias being controlled by the MEMS switch 505 may, for example, be at a voltage and/or frequency that the underlying semiconductor circuit technology is unable to provide. For example, the voltage level may be at a level beyond the breakdown voltage of electrical circuitry (e.g., CMOS circuitry) controlling the MEMS switch 505. The MEMS sensor 500 may, for example, comprise an accelerometer sensor, but the scope of various aspects of this disclosure is not limited to accelerometer sensors.

The MEMS switch 505 may, for example, be utilized to apply a bias 507 (e.g., a DC and/or AC bias) to the proof mass M and/or stationary portions of the MEMS sensor 500. Such a bias may, for example, be provided continually, as needed, periodically, etc. For example, the MEMS switch 505 may be activated to apply a bias 507 to the MEMS structural element(s) at sample times. For example, in an example scenario in which a sensor sample rate is 100 Hz, the MEMS switch 505 may be utilized to apply the bias 507 for each sample (e.g., in time for the bias 507 to reach steady state before the sample is taken) and then removed 100 times per second.

Also for example, the MEMS switch 505 may be utilized to apply the bias 507 during periods of use for particular MEMS sensors. For example, in a sensor circuit architecture comprising a plurality of sensors, the respective bias for each sensor may be separately controlled. Alternatively, in a scenario in which the plurality of sensors share a MEMS bias switch, a single bias may be applied to the plurality of sensors when any of the sensors are to be biased.

Additionally, the MEMS switch 505 may be utilized to provide an AC bias to the various MEMS structures. For example, the MEMS switch 505 may be operated to provide a square wave bias to the various MEMS structures as needed, for example to the proof mass M, to stationary components (e.g., sidewalls) of the MEMS sensor 500, etc.

Though the sensor circuit 500 of FIG. 5 is described generally herein in terms of an accelerometer, the scope of various aspects of this disclosure is not limited thereto. For example, the sensor circuit may comprise a MEMS magnetometer, barometer, etc. Also for example, the sensor may comprise various portion of a MEMS gyroscope that may be biased.

Figure 6:
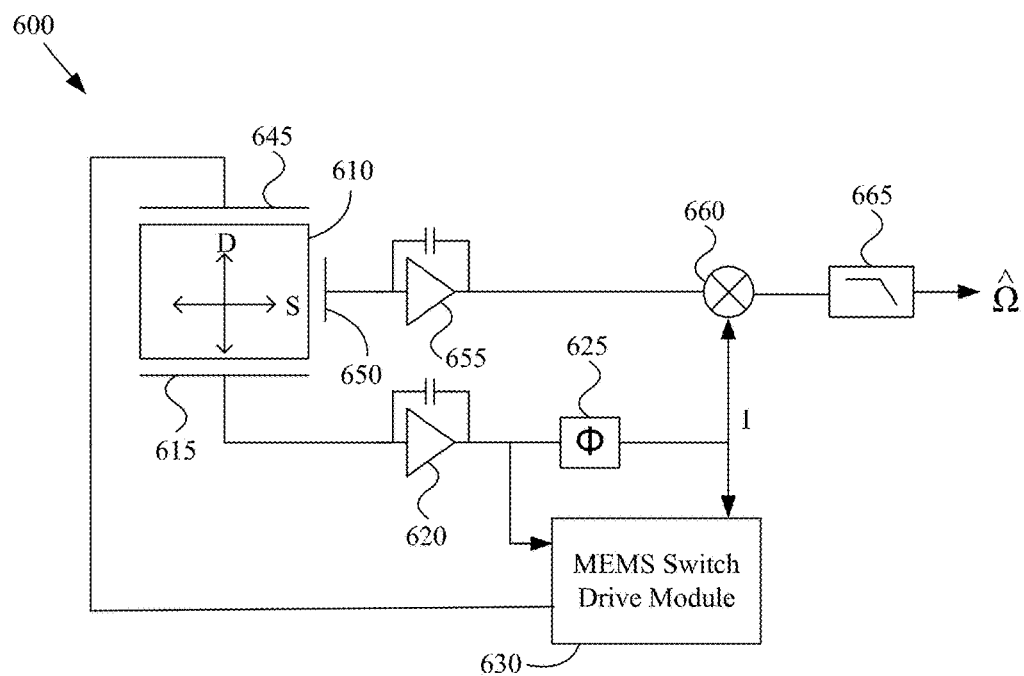
FIG. 6 shows an example block diagram of a MEMS sensor incorporating MEMS switching for drive control, in accordance with various aspects of the present disclosure.

As discussed herein, in addition to or instead of bias control, MEMS switches may be utilized to generate drive signals for driven MEMS sensor devices (e.g., MEMS gyroscope devices and/or other sensors with driven components). A non-limiting example of a MEMS gyroscope sensor circuit 600 that utilizes MEMS switching in accordance with various aspects of this disclosure is shown at FIG. 6. The circuit 600 and/or the components thereof may, for example, share any or all characteristics with the other example systems, circuits, and/or MEMS sensors discussed herein.

The sensor circuit 600 comprises a mass 610, which may also be referred to herein as a proof mass, which is driven in a vibratory or oscillatory manner in the drive direction, labelled "D" in FIG. 6. The drive circuitry may, for example, comprise a drive sensor 615 (e.g., a capacitive sensor or other type of sensor), a drive sense amplifier 620, a phase detector 625, a MEMS switch drive module 630, and a drive element 645 (e.g., an electrostatic drive element). The drive sensor 615 may, for example, sense movement of the proof mass 610 in the drive direction "D" and output a drive sense signal indicative of the sensed drive motion of the proof mass 610. The drive sense amplifier 620 may then amplify the drive sense signal provided by the drive sensor 615, and provide the amplified drive sense signal to the phase detector 625 and the MEMS switch drive module 630. The phase detector 625 outputs an in-phase signal "I" (which is in phase with the drive signal) to the MEMS switch drive module 630 to utilize in synchronizing the switching of the MEMS drive switch(es) in the drive module 630. The drive signal is then provided to the drive element 645, which generates the force (e.g., electrostatic force) to vibrate the proof mass 610. The MEMS switch drive module 630 may, for example, comprise one or more MEMS switches (e.g., any of the MEMS switches discussed herein) arranged in an inverter configuration to provide an AC drive voltage to the drive element 645.

The circuit 600 may also, for example, comprise a Coriolis sensor 650, a Coriolis sense amplifier 655, a sense mixer 660, and a low-pass filter 665. The Coriolis sensor 650 may, for example, sense movement of the proof mass 610 in the sense direction "S" and output a Coriolis sense signal indicative of the sensed motion of the proof mass 610. The signal output from the Coriolis sensor 650 will generally, for example, comprise a composite signal that includes a signal indicative of the Coriolis force caused by rotation of the gyroscope and also a quadrature signal. The Coriolis sense amplifier 655 may then amplify the Coriolis sense signal provided by the Coriolis sensor 650, and provide the amplified Coriolis sense signal to the sense mixer 660. The sense mixer 660 also receives the in-phase signal output by the phase detector 625. The sense mixer 660 mixes the in-phase signal and the amplified Coriolis sense signal to generate a signal with the quadrature components removed. The output of the sense mixer 660 is then filtered by low-pass filter (LPF) 665 and output as a signal Omega, which is indicative of the angular velocity at which the gyroscope is being rotated.

Other examples of gyroscope structures and/or circuitry may, for example, be found in commonly owned U.S. Pat. No. 8,833,162, titled "Micromachined Gyroscope Including a Guided Mass System," filed Sep. 16, 2011; and U.S. patent application Ser. No. 14/041,810, titled "Micromachined Gyroscope Including a Guided Mass System," filed Sep. 30, 2013, each of which are hereby incorporated herein by reference in its entirety.

The present disclosure provides various MEMS switch characteristics and various MEMS sensor implementations utilizing MEMS switches, for example for bias and/or drive control. The scope of this disclosure should not be limited to the particular MEMS switch and/or sensor implementation examples provided herein.

As discussed herein, any one or more of the functions (e.g., MEMS switching control functions, charge pump functions, sensor processing functions, etc.) may be implemented by a pure hardware design and/or by a processor (e.g., an application or host processor, a sensor processor, etc.) executing software instructions. Similarly, other examples may comprise or provide a non-transitory computer readable medium and/or storage medium, and/or a non-transitory machine readable medium and/or storage medium, having stored thereon, a machine code and/or a computer program having at least one code section executable by a machine and/or a computer (or processor), thereby causing the machine and/or computer to perform the functions as described herein.

In summary, various aspects of the present disclosure provide a system and/or method for utilizing MEMS switching technology to operate MEMS sensors (e.g., MEMS sensors having resonant MEMS structures, for example various implementations of gyroscopes, magnetometers, accelerometers, etc.). While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A microelectromechanical systems (MEMS) device comprising:
    an integrated circuit layer; and
    a MEMS switch on an upper surface of the integrated circuit layer and operable to switch a signal within a plane that is parallel to the upper surface of the integrated circuit layer, wherein the MEMS switch comprises:
        a post anchor;
        a flexible MEMS arm coupled to the post anchor, wherein the flexible MEMS arm is flexible within the plane;
        an actuator electrode located in the plane of the flexible MEMS arm; and
        a contact electrode located in the plane of the flexible MEMS arm.

2. The MEMS device of claim 1, wherein the contact electrode comprises a metal.

3. The MEMS device of claim 1, wherein the contact electrode comprises silicon.

4. The MEMS device of claim 1, wherein the contact electrode comprises a conductive coating.

5. The MEMS device of claim 1, wherein the integrated circuit layer comprises a CMOS layer.

6. The MEMS device of claim 1, comprising an anti-stiction coating on the contact electrode.

7. The MEMS device of claim 1, wherein the integrated circuit layer comprises a transistor configured to output a control signal to the actuator electrode, wherein the actuator electrode of the MEMS switch is electrically coupled to the transistor of the integrated circuit layer to receive the control signal, and wherein the MEMS switch is operable to switch the signal based on the received control signal.

8. The MEMS device of claim 7, wherein the integrated circuit layer comprises a CMOS layer.

9. The MEMS device of claim 7, wherein the signal is characterized by a voltage that is too high to be effectively switched by the transistor.

10. The MEMS device of claim 7, wherein the transistor operates in a range of voltages at or below a breakdown voltage of the transistor, and wherein the signal is characterized by a voltage that is above the breakdown voltage of the transistor.

* * * * *